US010605950B2

(12) United States Patent
Shao et al.

(10) Patent No.: US 10,605,950 B2
(45) Date of Patent: Mar. 31, 2020

(54) DOWNHOLE FORMATION EVALUATION USING NUCLEAR MAGNETIC RESONANCE INVERSION MATRIX REDUCTION

(71) Applicant: Halliburton Energy Services, Inc., Houston, TX (US)

(72) Inventors: Wei Shao, Conroe, TX (US); Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/565,735

(22) PCT Filed: Apr. 17, 2017

(86) PCT No.: PCT/US2017/027930
§ 371 (c)(1),
(2) Date: Oct. 11, 2017

(87) PCT Pub. No.: WO2017/184506
PCT Pub. Date: Oct. 26, 2017

(65) Prior Publication Data
US 2019/0033483 A1 Jan. 31, 2019

Related U.S. Application Data

(60) Provisional application No. 62/325,004, filed on Apr. 20, 2016.

(51) Int. Cl.
*G01V 3/32* (2006.01)
*G01R 33/44* (2006.01)

(52) U.S. Cl.
CPC ............... *G01V 3/32* (2013.01); *G01R 33/44* (2013.01)

(58) Field of Classification Search
CPC ........ G01V 3/32; G01N 24/08; G01N 24/081; G01R 33/50
See application file for complete search history.

(56) References Cited

U.S. PATENT DOCUMENTS 6,225,803 B1 * 5/2001 Chen ............... G01N 24/081
324/303
6,462,542 B1 10/2002 Venkataramanan et al.
(Continued)

FOREIGN PATENT DOCUMENTS

EP 0981062 A2 2/2000

OTHER PUBLICATIONS

International Search Report and the Written Opinion of the International Search Authority, or the Declaration, dated Jul. 25, 2017, PCT/US2017/027930, 16 pages, ISA/KR.
(Continued)

*Primary Examiner* — Elias Desta
(74) *Attorney, Agent, or Firm* — Haynes and Boone, LLP (57) ABSTRACT

A formation evaluation system reduces inversion matrixes used to determine formation properties, thereby increasing the memory management and processing efficiency of the evaluation system. NMR data is acquired from a wellbore and expressed mathematically by the system as a least squares solution to a linear system. The least squares solution is approximated using a numerical decomposition method and the evaluation system determines a formation property using the approximated least squares solution. Thereafter, a downhole operation may be planned, analyzed or conducted using the determined formation property.

13 Claims, 6 Drawing Sheets

(56) References Cited

U.S. PATENT DOCUMENTS

| | | | |
|---|---|---|---|
| 6,597,171 B2 | 7/2003 | Hurlimann et al. | |
| 7,705,592 B2 * | 4/2010 | Hursan | G01V 3/32 |
| | | | 324/301 |
| 7,821,260 B2 * | 10/2010 | Hamdan | G01N 24/081 |
| | | | 324/303 |
| 8,004,279 B2 * | 8/2011 | Kruspe | G01V 3/32 |
| | | | 324/303 |
| 8,022,698 B2 | 9/2011 | Rottengatter et al. | |
| 8,093,893 B2 * | 1/2012 | Niemeyer | G01N 24/081 |
| | | | 324/303 |
| 2003/0214286 A1 | 11/2003 | Heidler | |
| 2006/0186882 A1 | 8/2006 | Walsh | |
| 2009/0198446 A1 | 8/2009 | Hursan | |
| 2012/0306500 A1 | 12/2012 | Bittar et al. | |

OTHER PUBLICATIONS

Venkataramanan et al., "Solving Fredholm Integrals of the First Kind With Tensor Product Structure in 2 and 2.5 Dimensions," IEEE Transactions on Signal Processing, vol. No. 50, Issue No. 5, May 2002, pp. 1017-1026.

* cited by examiner

FIG. 1A

| ID | TW (ms) | TE (ms) | NE | Rpts | Delay (ms) | Pulse shape | Other remarks |
|---|---|---|---|---|---|---|---|
| 1A | >12S | 1 | 500 | 1 | | S | PAP across cycle |
| 1B | 1000 | 1 | 500 | 1 | | S | PAP across cycle |
| 1C | 30 | 0.2 | 50 | 24 | | S | PAP within repeats |
| 2A | >12S | 0.2 | 5000 | 1 | | S | PAP across cycle |
| 2B | 1500 | 0.2 | 5000 | 1 | | S | PAP across cycle |
| 2C | 30 | 0.2 | 50 | 24 | | S | PAP within repeats |
| 3A | >12S | 0.2 | 5000 | 1 | | S | PAP across cycle |
| 3B | 2800 | 0.2 | 5000 | 1 | | S | PAP across cycle |
| 3C | 30 | 0.2 | 50 | 24 | | S | PAP within repeats |
| 4A | >12S | 3 | 200 | 1 | | S | PAP across cycle |
| 4B | 2400 | 3 | 200 | 1 | | S | PAP across cycle |
| 4C | 30 | 0.2 | 50 | 24 | | S | PAP within repeats |
| 5A | >12S | 0.2 | 4000 | 1 | | S | PAP across cycle |
| 5B | 5600 | 0.2 | 4000 | 1 | | S | PAP across cycle |
| 6A | >12S | 0.2 | 3000 | 1 | | S | PAP across cycle |
| 6B | 500 | 0.2 | 475 | 1 | 5 | S | PAP across cycle |
| 6C | 500 | 0.2 | 475 | 1 | 5 | S | PAP across cycle |
| 6D | 100 | 0.2 | 225 | 1 | 5 | S | PAP across cycle |
| 6E | 100 | 0.2 | 100 | 1 | 5 | S | PAP across cycle |
| 6F | 50 | 0.2 | 100 | 1 | 5 | S | PAP across cycle |
| 7A | >12S | 0.2 | 2500 | 1 | | S | PAP across cycle |
| 7B | 500 | 0.2 | 475 | 1 | 5 | S | PAP across cycle |
| 7C | 150 | 0.2 | 225 | 1 | 5 | S | PAP across cycle |
| 7D | 75 | 0.2 | 100 | 1 | 5 | S | PAP across cycle |
| 7E | 50 | 0.2 | 100 | 1 | 5 | S | PAP across cycle |
| | | | | | | | |
| 8A | >12S | 0.2 | 2000 | 1 | | S | PAP across cycle |
| 8B | 200 | 0.2 | 225 | 1 | 5 | S | PAP across cycle |
| 8C | 100 | 0.2 | 225 | 1 | 5 | S | PAP across cycle |
| 8D | 50 | 0.2 | 100 | 1 | 5 | S | PAP across cycle |
| 8E | 50 | 0.2 | 100 | 1 | 5 | S | PAP across cycle |

DOWNHOLE FORMATION EVALUATION USING NUCLEAR MAGNETIC RESONANCE INVERSION MATRIX REDUCTION

PRIORITY

The present application is a U.S. National Stage patent Application of International Patent Application No. PCT/US2017/027930, filed on Apr. 17, 2017, which claims priority to United States Provisional Patent Application No. 62/325,004, filed on Apr. 20, 2016, both entitled, "DOWNHOLE FORMATION EVALUATION USING NUCLEAR MAGNETIC RESONANCE INVERSION MATRIX REDUCTION," and also naming Shao et al. as inventors, the disclosures of which are hereby incorporated by reference in their entirety.

FIELD OF THE DISCLOSURE

The present disclosure relates generally to downhole logging and, more specifically, to nuclear magnetic resonance ("NMR") inversion matrix reduction which provides increased computational efficiency and memory management.

BACKGROUND

In recent years, NMR logging has become very important for purposes of formation is evaluation and is one of the preferred methods for determining formation parameters. Improvements in NMR logging tools, as well as advances in data analysis and interpretation, allow log analysts to generate detailed reservoir description reports, including clay-bound and capillary-bound related porosity, estimates of the amounts of bound and free fluids, fluid types (i.e., oil, gas and water), permeability and other properties of interest.

Fluid typing and quantification is one of the primary objectives of using NMR logging in many formation evaluation programs. NMR based fluid typing techniques are based on the contrast of spin-relaxation relaxation time, $T_1$, spin-spin relaxation time, $T_2$, and/or diffusivity, D, of different fluids in the porous space of formation rocks. Therefore, the quality of detecting and resolving different fluids lie on a proper data acquisition method to capture the contrast and a proper data processing method to recover the contrast with minimal distortion by noise or processing artifacts. To accomplish this, modern NMR well logging tools and core analysis instruments acquire a large amount data with different acquisition parameters and pulse sequences, resulting in multiple echo trains of thousands elements each. The fluid contrast is captured but imbedded in the time evolution of NMR signal amplitudes acquired with these variations of parameters and pulse sequences.

Often, an inversion algorithm is applied to derive the distributions of $T_1$, $T_2$, and D, or a subset of these, from the time-domain NMR measurements. The size of the inversion matrixes can become significantly large, thus resulting in poor system performance or system failure. Therefore, it is essential to address these memory management and computational efficiency challenges associated with processing inversion of NMR data.

DESCRIPTION OF ILLUSTRATIVE EMBODIMENTS

Illustrative embodiments and related methods of the present disclosure are described below as they might be employed in downhole formation evaluation using NMR inversion matrix reduction. In the interest of clarity, not all features of an actual implementation or method are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methods of the disclosure will become apparent from consideration of the following description and drawings.

As described herein, illustrative embodiments and methods of the present disclosure describe formation evaluation systems that reduce inversion matrixes used to determine formation properties, thereby increasing the memory management and processing efficiency of the evaluation system. In a generalized method, an NMR logging assembly is deployed along a formation surrounding a wellbore, and NMR data is acquired. The acquired NMR data is then expressed mathematically by the system as a least squares solution to a linear system. The least squares solution is then approximated using a numerical decomposition method, such as, for example, orthogonal-triangular decomposition. The evaluation system then determines a property of the formation using the approximated least squares solution. Thereafter, a downhole operation may be planned, analyzed or conducted using the determined formation property.

As previously stated, fluid typing and quantification is one of the primary objectives of using NMR logging in many formation evaluation programs. NMR based fluid typing techniques are based on the contrast of spin-lattice relaxation time, $T_1$, spin-spin relaxation time, $T_2$, and/or diffusivity, D, of different fluids in the porous space of formation rocks. Therefore, the quality of detecting and resolving different fluids depend on a proper data acquisition method to capture the contrast and a proper data processing method to recover the contrast with minimal distortion by noise or processing artifacts. To accomplish this, NMR well logging tools and core analysis instruments acquire a large amount of data with different acquisition parameters and pulse sequences, resulting in multiple echo trains of thousands of elements each. The fluid contrast is captured but imbedded in the time evolution of NMR signal amplitudes acquired with these variations of parameters and pulse sequences.

Often, an inversion algorithm is applied to derive the distributions of $T_1$, $T_2$, and D, or a subset of these, from the time-domain NMR measurements. When the distributions of all three parameters are derived, the inversion algorithm is often called 3D inversion; when the distributions of the two out of the three parameters derived, the inversion algorithm is often called 2D inversion. The size of the inversion matrix is proportional to the multiplication of the number of unknowns of each dimension and the number of data, thus 2D and 3D increases the matrix size significantly compared to 1D inversion. Therefore, it is essential to address the memory management and computational efficiency of processing inversion of NMR data for while logging (real-time) operation and for post-data-acquisition data processing.

According to certain illustrative methods defined herein, an NMR inversion process involves solving the following linear system:

$$Ax = b \quad \text{Eq. (1)},$$

where A is a matrix of size M×N, and b is the NMR response vector of size M×1 (i.e., the total number of echo trains).

However, solving the linear system in Eq. (1) can be computationally expensive. For $T_1$-$T_2$ 2D inversion, for example, assuming the NMR responses are acquired from a simple activation of 8 different echo trains, each with a distinct wait time and having the length of the echo trains equal to 5000, 5000, 2000, 1000, 500, 200, 100, and 50, respectively, the total number of echoes is 13,850. In the linear inversion model, if one uses 54 unknowns to represent a $T_1$ distribution and the same number of bins to represent the $T_2$ distribution, then M=13,850, and N=54×54=2916. The memory needs to store the matrix A in double precision is around 308 MB. The actual NMR data acquisition can be more complicated if $T_1$ and $T_2$ distributions, as well as diffusivity distributions, are desired. A typical multifrequency, multi-gradient NMR logging tool may acquire tens of thousands of echoes.

Figure 1A:
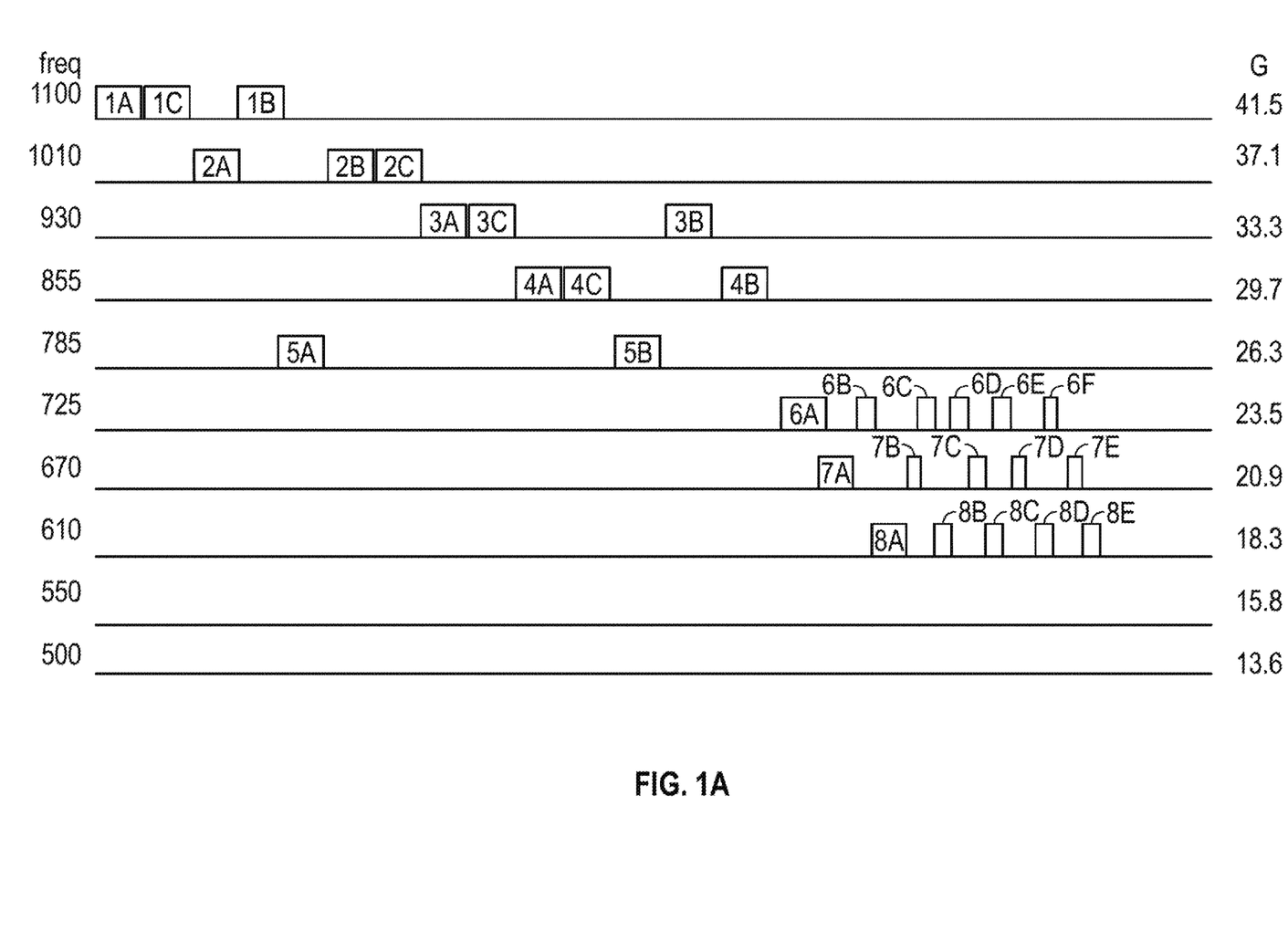
FIG. 1A shows a hypothetical NMR logging pulse sequence time diagram, according to certain illustrative embodiments of the present disclosure.
Figure 1B:
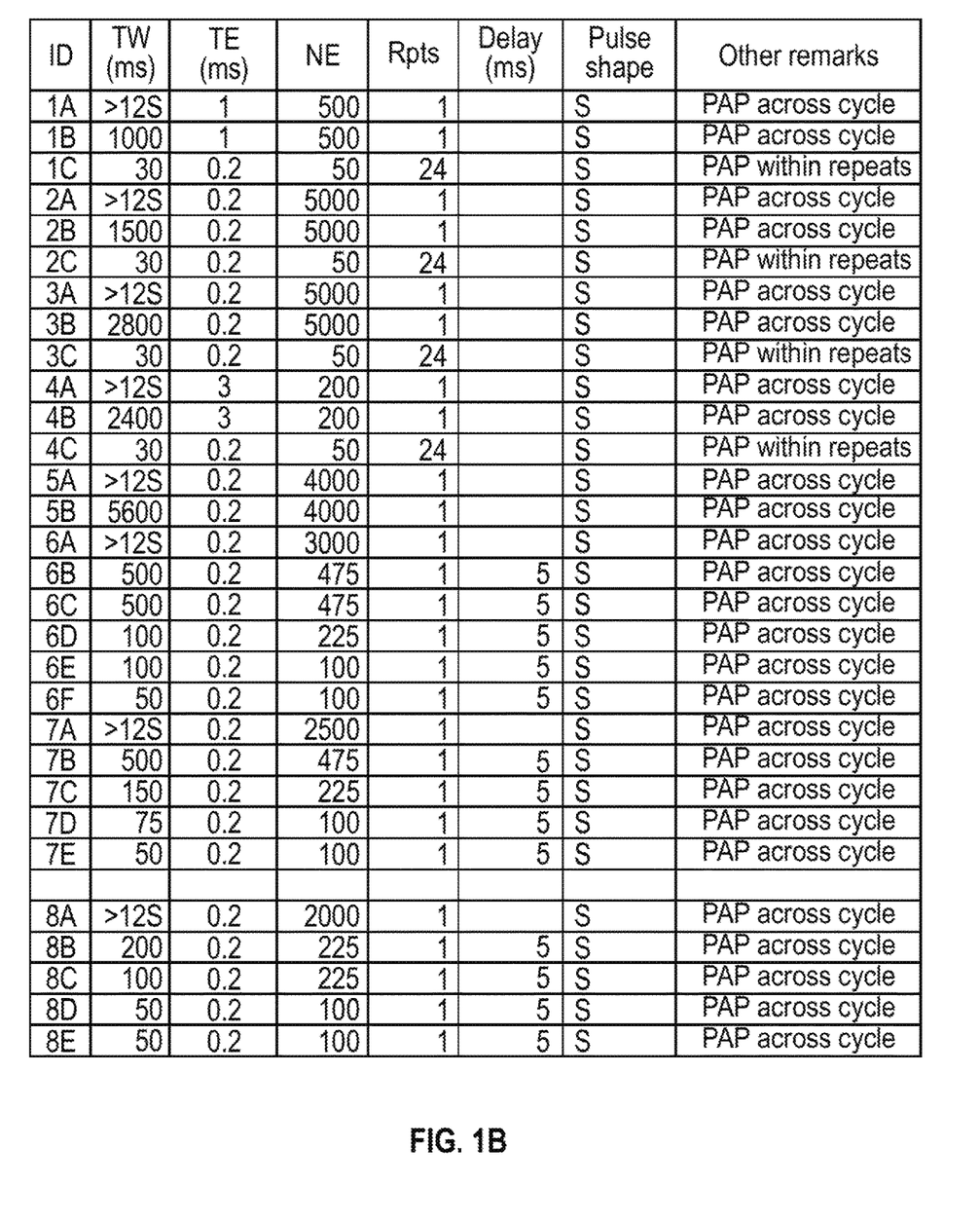
FIG. 1B is a table which lists the various NMR acquisition parameters for each acquisition sequence displayed in FIG. 1A.

In an illustrative data acquisition scheme, illustrated in FIG. 1A, and the associated parameters shown in the table of FIG. 1B, the total number of echoes, M=40,025. FIG. 1A shows a hypothetical NMR logging pulse sequence time diagram. In the illustration, eight different frequencies are used to run NMR measurements which yields 30 different types of echo trains with at least one variation of the data acquisition parameters, such as operating frequency f, the interecho time TE, the wait time TW, the echo train length NE, and/or the number of repetitions. FIG. 1B shows a table that lists the various NMR acquisition parameters for each acquisition sequence displayed in FIG. 1A. If the same 54 bins are used in obtain $T_1$ and $T_2$ distributions, the memory needs to store the matrix A in double precision is 890 MB. Such memory requirement is impractical for processing NMR data in real time, or even for post processing implementation.

Accordingly, the illustrative embodiments and methods described herein address these deficiencies. As described herein, the reduction of memory requirements for NMR inversion is achieved by approximating a least squares solution to the linear system of Eq. (1) with, for example, the orthogonal-triangular decomposition ("QR") method. The least squares solution to the linear system of Eq. (1) is described in the following Eq. (2). The QR method is applied to the NMR matrix A' to reduce the memory requirement for computing A'b. A'b is the projection of NMR data b into the row vector space of A'. The QR method approximates the row vector space of A' with only a few vectors.

The least square solution to the linear system of Eq. (1) is:

$$x_{ls} = (A'A + \alpha L'L)^{-1} A'b \quad \text{Eq. (2)},$$

where L is the regularization matrix of size N×N, and a is the regularization parameter.

In certain illustrative embodiments, only the $0^{th}$ order regularization and the $2^{nd}$ order regularization is considered. The $0^{th}$ order regularization and the $2^{nd}$ order regularization matrices are sparse matrices which require very little memory. Also the matrices of A'A and L'L are the matrices of size N×N, where N is the number of unknowns. Hence the memory required for the matrices A'A and L'L is independent of the size of acquired NMR data.

In one example, for NMR data consisting of multiple echo trains, the matrix A can be written in the following form:

$$A = \begin{pmatrix} A_1 \\ \vdots \\ A_i \\ \vdots \\ A_P \end{pmatrix}, \quad \text{Eq. (3)}$$

where P is the number of echo trains for a given activation set, $A_i$ is the NMR matrix for the $i^{th}$ echo train in the following form for $T_1$-$T_2$ inversion:

$$A_i = \left( \left(1 - e^{-\frac{TW_i}{T_{1,m}}}\right) e^{-\frac{k \cdot TE_i}{T_{2,n}}} \right)_{m=1:N, n=1:N}^{k=1:NE_i} \quad \text{Eq. (4)}$$

$TW_i$, $TE_i$, and $NE_i$ are NMR acquisition parameters for the $i^{th}$ echo train. For $T_1$-$T_2$ inversion, $TE_1$ are the same for all the echo trains (i.e., 0.2 ms for the activation set in FIG. 1B), and $M = NE_1 + NE_i + \ldots NE_p$ is the total number of echoes. Thus, the NMR response b is in the following form:

$$b = \begin{pmatrix} b_1 \\ \vdots \\ b_i \\ \vdots \\ b_P \end{pmatrix}, \quad \text{Eq. (5)}$$

where $b_i$ is the NMR response vector for the $i^{th}$ echo train with $NE_i$ echoes.

For D-$T_2$ inversion:

$$A_i = \left( \left(1 - e^{-\frac{TW_i}{R \cdot T_{2,n}}}\right) e^{-\frac{k \cdot TE_i}{T_{2,n}} - \frac{\gamma^2 G_i^2 TE_i^2 D_m^2 k \cdot TE_i}{12}} \right)_{m=1:N, n=1:N}^{k=1:NE_i}, \quad \text{Eq. (6)}$$

where R is the $T_1/T_2$ ratio.

For D-$T_1$ inversion:

$$A_i = \left( \left(1 - e^{-\frac{TW_i}{T_{1,n}}}\right) e^{-\frac{k \cdot TE_i \cdot R}{T_{1,n}} - \frac{\gamma^2 G_i^2 TE_i^2 D_m^2 k \cdot TE_i}{12}} \right)_{m=1:N, n=1:N}^{k=1:NE_i}, \quad \text{Eq. (7)}$$

where R is the $T_1/T_2$ ratio.

Therefore, the least square solution Eq. (2) can be rewritten in the following form:

$$x_{ls}=(\Sigma_{i=1}^{P}A'_iA_i+\alpha L'L)^{-1}(\Sigma_{i=1}^{P}A'_ib_i) \qquad \text{Eq. (8)}.$$

Assuming the orthogonal-triangle decomposition of each $A'_i$ is in the following form:

$$A'_i=Q_iR_iE_i \qquad \text{Eq. (9)},$$

where $Q_i$ is a unitary matrix, $R_i$ is an upper triangular matrix, and $E_i$ is a permutation matrix to ensure that absolute values of the diagonals of $R_i$ are decreasing. Then, the approximation of the least squares solution is expressed as:

$$x_{ls}=(\Sigma_{i=1}^{P}A'_iA_i+\alpha L'L)^{-1}(\Sigma_{i=1}^{P}Q_iR_iE_ib_i)=(\Sigma_{i=1}^{P}A'_iA_i+\alpha L'L)^{-1}(\Sigma_{i=1}^{P}\Sigma_{k=1}^{N}(r_{i,k}(E_ib_i))q_{i,k}) \qquad \text{Eq. (10)}$$

where $q_{i,k}$ is the $k^{th}$ column vector of the matrix $Q_i$, and $r_{i,k}$ is the $k^{th}$ row vector of the matrix $R_i$.

Figure 2:
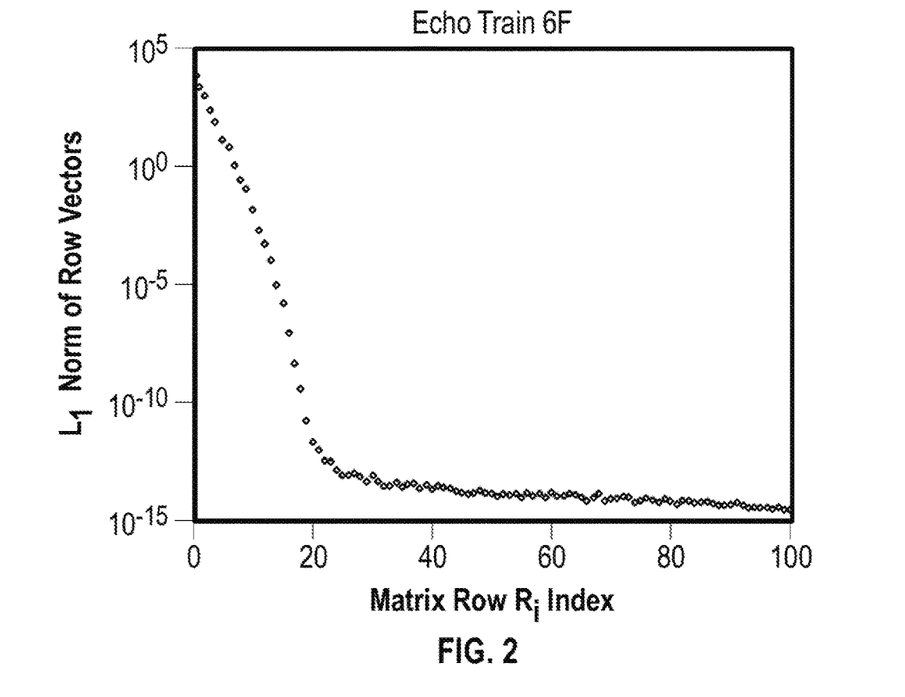
FIGS. 2 and 3 show the $L_1$ norms of $r_{i,k}$ for the echo train 6F and echo train 2A of FIG. 1B, respectively.
Figure 3:
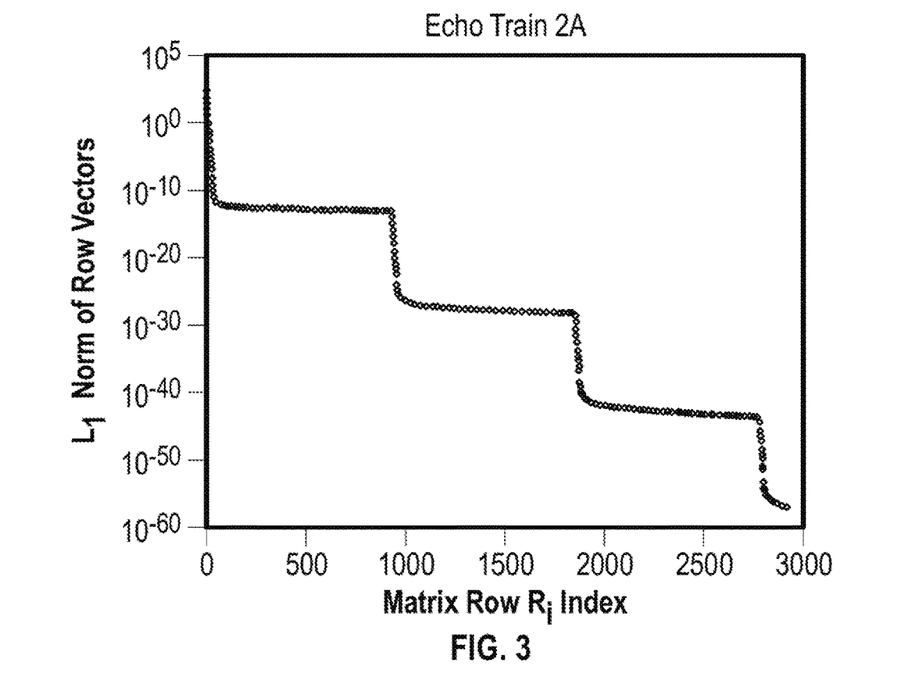

For NMR inversion, the $L_1$ norm of $r_{i,k}$ decay towards zero rapidly. The $L_1$ norm of $r_{i,k}$ is defined as $\|r_{i,k}\|_1=\Sigma_{l=1}^{NE_i}|r_{i,k,l}|$. FIGS. 2 and 3 show the $L_1$ norms of $r_{i,k}$ for the echo train 6F and echo train 2A, respectively. For echo train 2A, the $L_1$ norms of row vectors after the $31^{th}$ row vector are less than 1e-5, and $\Sigma_{k=31}^{2916}\|r_{i,k}\|_1<10^{-4}$. For echo train 6F, the $L_1$ norms of row vectors after the $15^{th}$ row vector are less than 1e-5, and $\Sigma_{k=15}^{2916}\|r_{i,k}\|_1<10^{-5}$. Thus, the terms $(r_{i,k}(E_ib_i))$ for those row vectors are very small which can be ignored (and thus not stored to memory or analyzed).

Therefore $\Sigma_{i=1}^{P}\Sigma_{k=1}^{N}(r_{i,k}(E_ib_i))q_{i,k}$ in Eq. (10) which involves the NMR responses can be approximated to:

$$\Sigma_{k=1}^{N}(r_{i,k}(E_ib_i))q_{i,k}=\Sigma_{k=1}^{K_i}(r_{i,k}(E_ib_i))q_{i,k}+\Sigma_{k=K_i+1}^{N}(r_{i,k}(E_ib_i))q_{i,k}\approx\Sigma_{k=1}^{K_i}(r_{i,k}(E_ib_i))q_{i,k} \qquad \text{Eq. (11)}.$$

The $K_i$ is a cutoff index such that $\Sigma_{k=K_i+1}^{N}\|r_{i,k}\|_1<10^{-4}$, then the approximation error of using Eq. (11) is bounded by:

$$|\Sigma_{k=K_i+1}^{N}(r_{i,k}(E_ib_i))q_{i,k}|<\max(b_i)\,\Sigma_{k=K_i+1}^{N}\|r_{i,k}\|_1<10^{-4}\max(b_i) \qquad \text{Eq. (12)}$$

Accordingly, one advantage of using the approximation of Eq. (10) is to reduce the memory requirements for storing the matrix $A_i$. The evaluation system only needs to store up to $K_i$ row vectors for $R_i$, and $K_i$ column vectors for $Q_i$. For example, $K_i$ for echo train 2A is 30. The memory for storing partial $R_i$ and $Q_i$ is less than 2 MB, comparing with 111 MB memory for storing the matrix $A_i$. As for the permutation matrix $E_i$, it can be stored in a vector of size $N_i$ which requires very little memory.

The echo bursts, such as 6F, are designed to have much higher S/N than other echo trains to ensure the accuracy of partial porosities and total porosities from the NMR inversion. In some instances, it may be desirable not to apply the QR approximation to the NMR responses from these echo bursts. Fortunately, the memories for storing the matrixes related to these echo bursts are very small. The memory for storing the matrix for echo train 6F is about 2.2 MB.

Comparing the present disclosure with conventional approaches, the matrix truncation method described herein is only applied to the NMR data with a QR decomposition method, or a similar numerical decomposition method, and the approximation errors are very small. The NMR inversion system is essentially undisturbed by the approximation described herein. Furthermore, the methods of the present disclosure may be applied to echo trains separately which allows the NMR burst data be processed differently. In contrast, conventional methods perform 2D inversion by expressing the inversion matrix as the tensor product of two kernels, and the data is compressed by singular value decomposition of the kernels.

For the term $\Sigma_{i=1}^{P}A'_iA_i+\alpha L'L$ in Eq. (8), its size is N×N, where N is the number of unknowns. The memory requirement is about 65 MB for the activation set in FIG. 1B for N=54 (65 MB is manageable for a variety of platforms). In the disclosed methods, $\Sigma_{i=1}^{P}A'_iA_i+\alpha L'L$ can be used without any approximation while conventional approaches approximate the NMR inversion kernel and data, and the degree of NMR data compression depends on the NMR inversion kernel approximation.

In an alternative embodiment, the disclosed methods can also reduce the memory requirement by approximating $\Sigma_{i=1}^{P}A'_iA_i+\alpha L'L$ with a QR decomposition method. However, the QR decomposition is applied to the matrix $A_i$ instead of its transpose as in Eq. (9). Here, $$A_i=Q_i^0R_i^0E_i^0 \qquad \text{Eq. (13)}$$

where $Q_i^0$ is a unitary matrix, $R_i^0$ is an upper triangular matrix, and $E_i^0$ is a permutation matrix to ensure that absolute values of the diagonals of $R_{i,0}$ are decreasing. The superscript 0 indicates the QR decompositions of the matrix $A_i$. Then, $$A'_iA_i=(E_i^0)'(R_i^0)'R_i^0E_i^0 \qquad (14).$$

Figure 4:
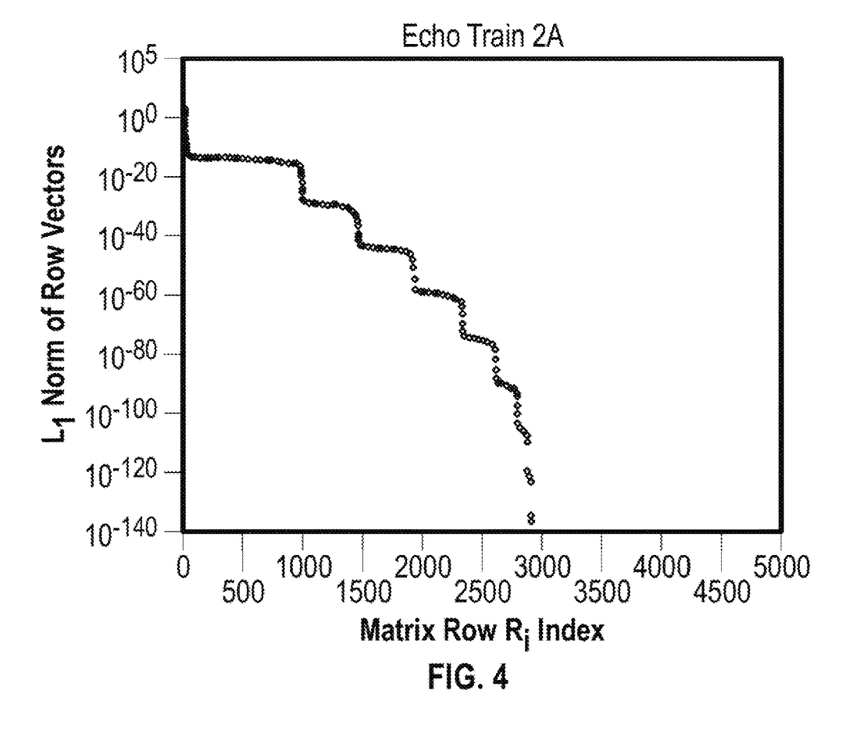
FIGS. 4 and 5 show the $L_1$ norm of row vectors of $R_i^o$ for echo train 2A and 6F of FIG. 1B, respectively.
Figure 5:
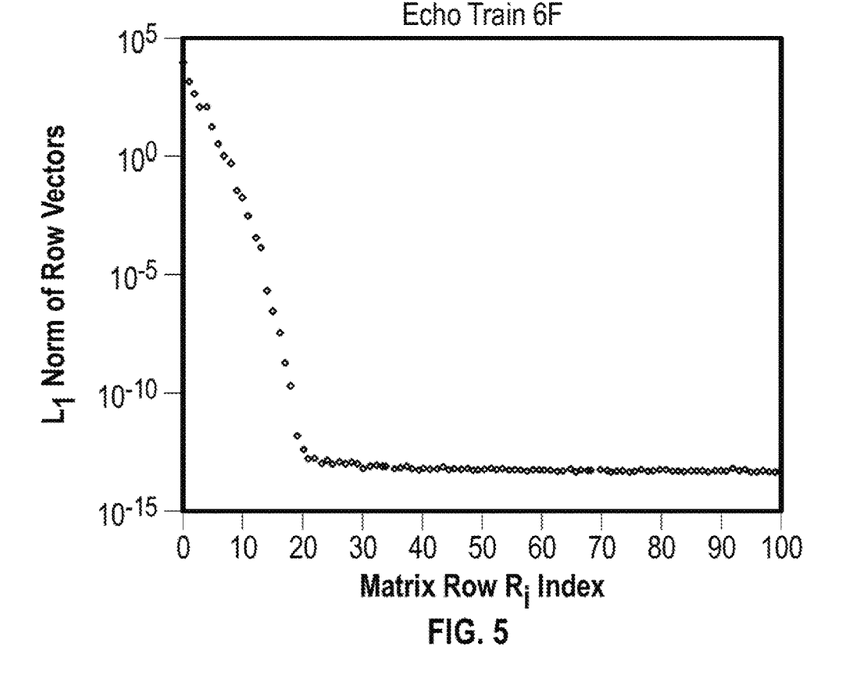

Here, the $L_1$ norm of row vectors of $R_i^0$ also decay to zero rapidly. FIGS. 4 and 5 show the $L_1$ norm of row vectors of $R_i^0$ for echo train 2A and 6F. For echo train 2A, its $32^{th}$ row vector begins to be less than 1e-5, and $\Sigma_{k=33}^{5000}\|r_{i,k}\|_1<10^{-5}$. For echo train 6F, its $15^{th}$ row vector begins to be less than 1e-5, and $\Sigma_{k=16}^{100}\|r_{i,k}\|_1<10^{-5}$.

Then, the method approximates $A'_iA_i$ with the following:

$$A'_iA_i=(E_i^0)'(R_i^0)'R_i^0E_i^0\approx(E_i^0)'(R_{i,K_i}^0)'R_{i,K_i}^0E_i^0 \qquad \text{Eq. (15)},$$

where $R_{i,K_i}^0$ is the submatrix that consists of the first $K_i$ rows, the $K_i$ is chosen such that $\Sigma_{k=K_i}^{N_i}\|r_{i,k}\|_1<10^{-4}$. Then the memory required to store $A_i$ can be reduced significantly by storing $R_{i,K_i}^0$ only, and the permutation matrix can be stored in a vector.

If, in certain illustrative methods, the matrix approximation is used as described in Eq. (15), the least square solution Eq. (6) is solved by using an iterative method to avoid the inverse matrix operation of $\Sigma_{i=1}^{P}A'_iA_i+\alpha L'L$, which will require the same amount of memory to store the inverse matrix. For simplicity, consider the example of an iterative method for L=I (identity matrix). An illustrative iterative method is described as the following:

$$x_{k+1}=\frac{1}{\alpha+\gamma}\left(\left(\gamma I-\sum_{i=1}^{P}A'_iA_i\right)x_k+\left(\sum_{i=1}^{P}A'_ib_i\right)\right)\approx\frac{1}{\alpha+\gamma}\left(\left(\gamma I-\sum_{i=1}^{P}(E_i^0)'(R_{i,K_i}^0)'R_{i,K_i}^0E_i^0\right)x_k+\left(\sum_{i=1}^{P}\sum_{k=1}^{K_i}(r_{i,k}(E_ib_i))q_{i,k}\right)\right), \qquad (18)$$

where γ is a control parameter to ensure the convergence of the iterative method, for example, γ can be chosen as the largest singular value.

Accordingly, the illustrative methods described herein provide a number of advantages. Comparing with conventional approaches, the matrix truncation method described in the current disclosure has two distinctive features: (1) the application of a QR decomposition method (or similar numerical decomposition method) to approximate the NMR data only, and the approximation error is so small that NMR solutions from the inversion are not affected by the NMR approximation. The NMR inversion kernel is essentially undisturbed with the present method. Then, number (2): the present method is applied to individual echo trains separately, which allows the flexibility of applying the truncation only to long echo train data that corresponds to large matrixes and leaving the high-SNR, partially polarized short echo bursts data intact. Therefore, the current disclosure provides a memory-friendly and computational efficient method that delivers real-time and post-processing 2D and 3D NMR product.

The methods described herein may be implemented using a formation evaluation system having processing circuitry necessary (i.e., system control center) to achieve the approximations in real-time. The system may include a variety of deployments, such as, for example, a logging-while-drilling ("LWD"), measurement-while-drilling ("MWD") or wireline assembly in which the methods described herein may be performed downhole (real-time) or at some remote location (post-processing). Such circuitry may include a communications unit to facilitate interaction between the logging system and a remote location (such as the surface). A visualization unit may also be connected to communications unit to monitor the NMR data being processed; for example, an operator may intervene in the system operations based on this data. A data processing unit may convert the received data into formation properties including, for example, porosity, permeability, pore size of the formation, etc. Thereafter, results may be displayed via the visualizing unit.

The system control center may also include storage/communication circuitry necessary to perform the calculations/approximations described herein. In certain embodiments, that circuitry is communicably coupled to NMR sensors in order to process the received NMR signals. The circuitry may be on-board the logging tool or remotely located. Additionally, the circuitry on-board the logging assembly may be communicably coupled via wired or wireless connections to the surface to thereby communicate data back uphole and/or to other assembly components. In an alternate embodiment, the system control center or other circuitry necessary to perform one or more aspects of the techniques described herein may be located at a remote location away from the logging assembly, such as the surface or in a different wellbore. In other embodiments, the NMR measurements may be communicated remotely to the system control center for processing.

Thus, all or portions of the processing may occur downhole or at a remote location (e.g., the surface). These and other variations will be readily apparent to those ordinarily skilled in the art having the benefit of this disclosure.

Moreover, the on-board or remote circuitry includes at least one processor and a non-transitory and computer-readable storage, all interconnected via a system bus. Software instructions executable by the system control center for implementing the illustrative methods described herein in may be stored in local storage or some other non-transitory computer-readable medium. It will also be recognized that the positioning software instructions may also be loaded into the storage from a CD-ROM or other appropriate storage media via wired or is wireless methods.

Moreover, various aspects of the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof in a computer system or other processing system.

Figure 6:
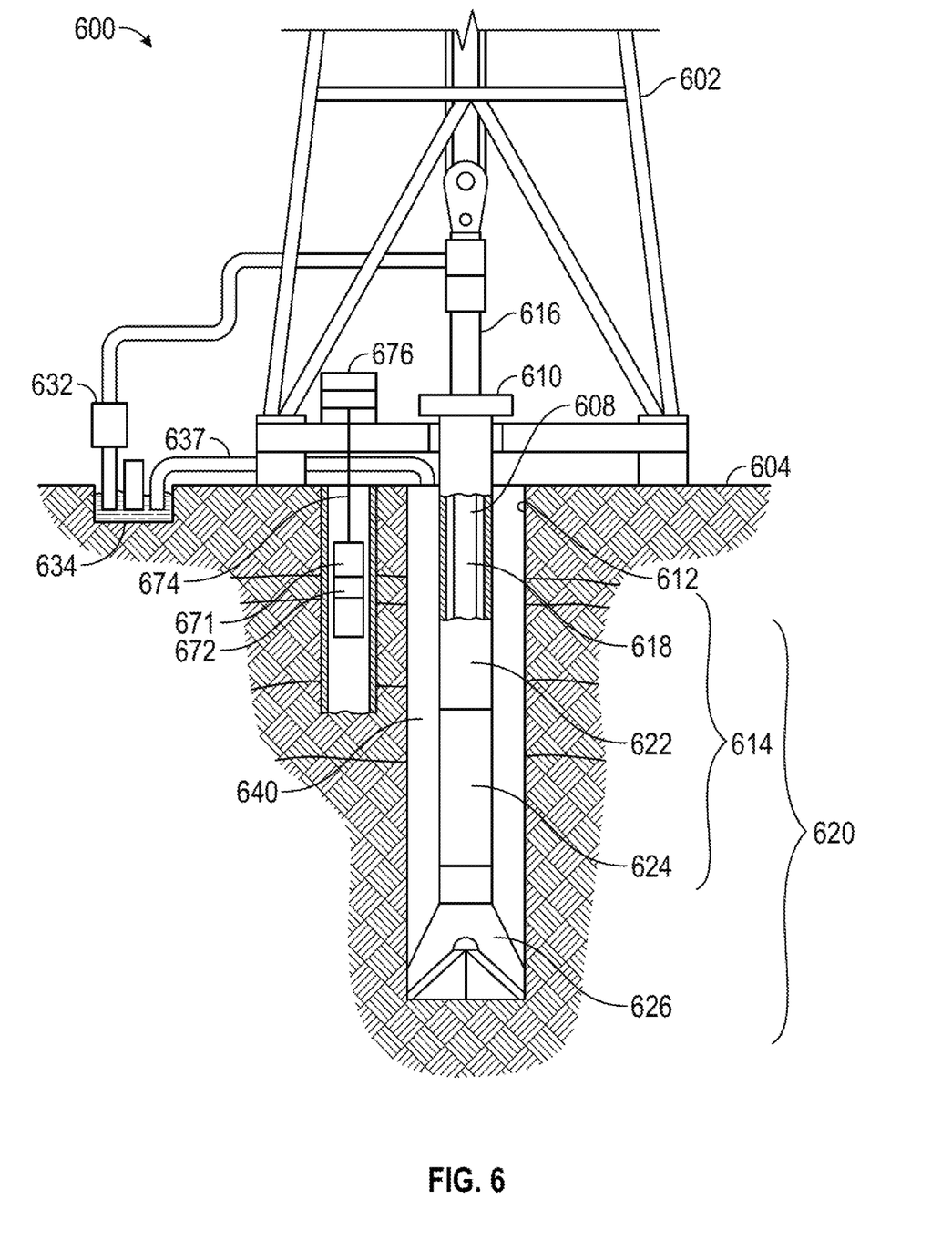
FIG. 6 illustrates a system for downhole formation evaluation, according to certain illustrative embodiments of the present disclosure.

As mentioned above, the systems described herein may be deployed using, for example, LWD, MWD or wireline deployments. FIG. 6 illustrates a system 600 for downhole formation evaluation, according to certain illustrative embodiments of the present disclosure. System 600 includes a drilling rig 602 located at a surface 604 of a wellbore. Drilling rig 602 provides support for a downhole apparatus, including a drill string 608. Drill string 608 penetrates a rotary table 610 for drilling a wellbore 612 through subsurface formations 614. Drill string 608 includes a Kelly 616 (in the upper portion), a drill pipe 618 and a bottomhole assembly 620 (located at the lower portion of drill pipe 618). In certain illustrative embodiments, bottomhole assembly 620 may include drill collars 622, a downhole tool 624 and a drill bit 626. Although downhole tool 624 may be any of a number of different types of tools including MWD tools, LWD tools, etc., in this embodiment downhole tool 624 is an NMR logging tool as described herein.

During drilling operations, drill string 608 (including Kelly 616, drill pipe 618 and bottom hole assembly 620) may be rotated by rotary table 610. In addition or alternative to such rotation, bottom hole assembly 620 may also be rotated by a motor that is downhole. Drill collars 622 may be used to add weight to drill bit 626. Drill collars 622 also optionally stiffen bottom hole assembly 620 allowing it to transfer the weight to drill bit 626. The weight provided by drill collars 622 also assists drill bit 626 in the penetration of surface 604 and subsurface formations 614.

During drilling operations, a mud pump 632 optionally pumps drilling fluid (e.g., drilling mud), from a mud pit 634 through a hose 636, into drill pipe 618, and down to drill bit 626. The drilling fluid can flow out from drill bit 626 and return back to the surface through an annular area 640 between drill pipe 618 and the sides of wellbore 612. The drilling fluid may then be returned to the mud pit 634, for example via pipe 637, and the fluid is filtered. The drilling fluid cools drill bit 626, as well as provides for lubrication of drill bit 626 during the drilling operation. Additionally, the drilling fluid removes the cuttings of subsurface formations 614 created by drill bit 626.

Still referring to FIG. 6, downhole tool 624 may also include any number of sensors which monitor different downhole parameters and generate data that is stored within one or more different storage mediums within the downhole tool 624. Alternatively, however, the data may be transmitted to a remote location (e.g., surface) and processed accordingly. Such parameters may include NMR logging data related to the various characteristics of the subsurface formations (such as resistivity, radiation, density, porosity, etc.) and/or the characteristics of the wellbore (e.g., size, shape, etc.), etc.

FIG. 6 also illustrates an alternative embodiment in which a wireline-based NMR logging tool is deployed. In such an embodiment, the wireline system may include a downhole tool body 671 coupled to a base 676 by a logging cable 674. Logging cable 674 may include, but is not limited to, a wireline (multiple power and communication lines), a mono-cable (a single conductor), and a slick-line (no conductors for power or communications). Base 676 is positioned above ground and optionally includes support devices, communication devices, and computing devices. Tool body 671 houses any one of the NMR logging tools 672 described herein. In an embodiment, a power source (not shown) is positioned in tool body 671 to provide power to the tool 671. In operation, the wireline system is typically sent downhole after the completion of a portion of the drilling. More specifically, in certain methods, drill string 508 creates wellbore 612, then drill string 608 is removed, and the wireline system is inserted into wellbore 612, as will be understood by those ordinarily skilled in the art having the benefit of this disclosure. Note that only one wellbore is shown for simplicity in order to show the tools deployed in drilling and wireline applications. In certain applications, such as ranging, multiple wellbores would be drilled as understood in the art.

Figure 7:
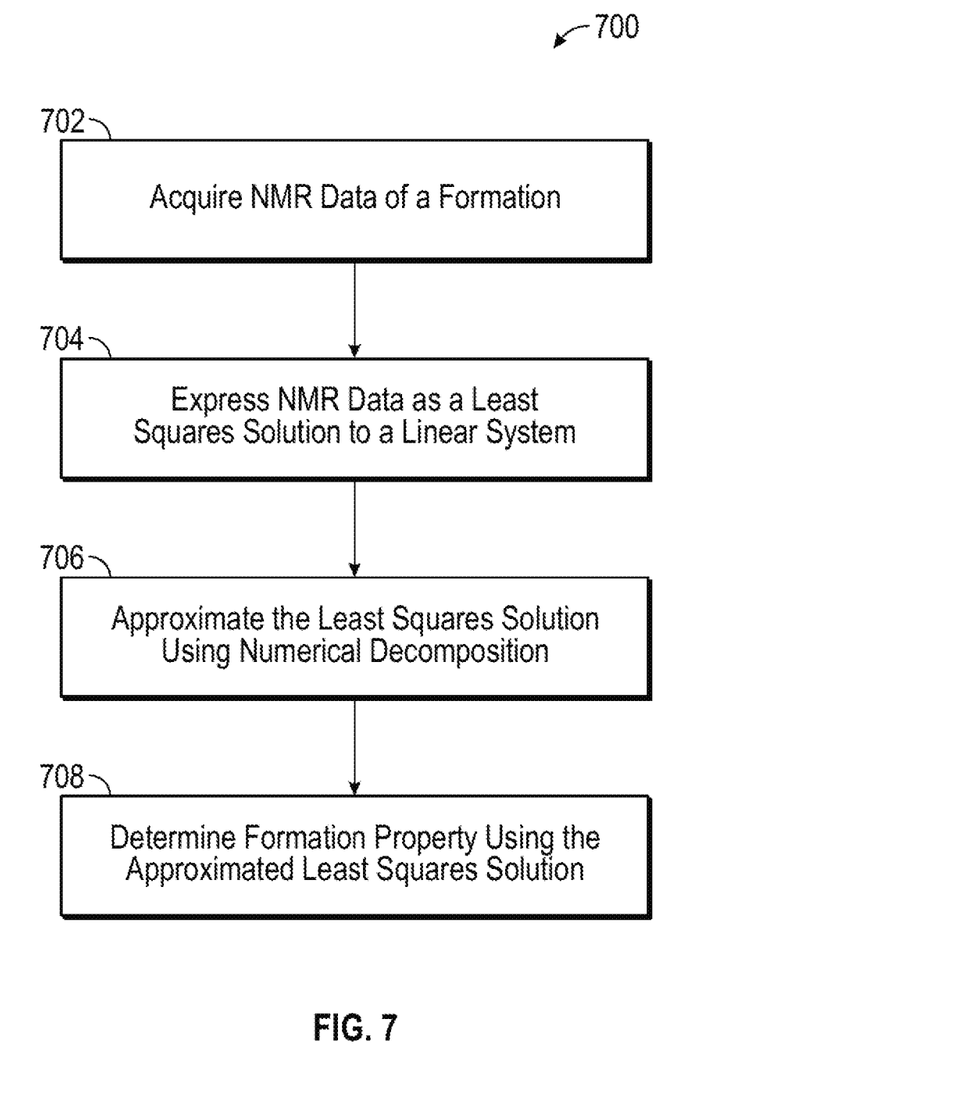
FIG. 7 is a flow chart of a formation evaluation method, according to certain illustrative methods of the present disclosure.

FIG. 7 is a flow chart of a formation evaluation method 700, according to certain illustrative methods of the present disclosure. In one example, a logging assembly is deployed downhole and NMR data of a formation is acquired at block 702. At block 704, the NMR data is expressed as a least squares solution to a linear system by the system processing circuitry. At block 706, the least squares solution is approximated using numerical decomposition. At block 708, formation properties may then be determined using the approximated least squares solution, as described herein.

Embodiments and methods described herein further relate to any one or more of the following paragraphs:

1. A formation evaluation method, comprising acquiring nuclear magnetic resonance ("NMR") data of a formation surrounding a wellbore; expressing the NMR data as a least squares solution to a linear system; approximating the least squares solution using numerical decomposition; and determining a property of the formation using the approximated least squares solution.

2. A method as defined in paragraph 1, wherein the approximation is performed using an orthogonal-triangular decomposition method.

3. A method as defined in paragraphs 1 or 2, wherein the NMR data comprises a plurality of echo trains; and the approximation is selectively applied to each echo train separately.

4. A method as defined in any of paragraphs 1-3, wherein selectively applying the approximation to each echo train comprises determining which echo trains to approximate.

5. A method as defined in any of paragraphs 1-4, wherein the NMR data comprises a plurality of echo trains expressed as a matrix $A_i$; and the numerical decomposition is applied to matrix $A_i$.

6. A method as defined in any of paragraphs 1-5, wherein the NMR data comprises a plurality of echo trains expressed as a matrix $A_i$; and the numerical decomposition is applied to a transpose of the matrix $A_i$, the transpose being expressed as $A'_i$.

7. A method as defined in any of paragraphs 1-6, wherein the approximated least squares solution is expressed as:

$$x_{ls} = (\Sigma_{i=1}^{P} A'_i A_i + \alpha L'L)^{-1} (\Sigma_{i=1}^{P} Q_i R_i E_i b_i) = \\ (\Sigma_{i=1}^{P} A'_i A_i + \alpha L'L)^{-1} (\Sigma_{i=1}^{P} \Sigma_{k=1}^{N} (r_{i,k}(E_i b_i)) q_{i,k}) \approx \\ (\Sigma_{i=1}^{P} A'_i A_i + \alpha L'L)^{-1} (\Sigma_{i=1}^{P} \Sigma_{k=1}^{K_i} (r_{i,k}(E_i b_i)) q_{i,k}).$$

8. A method as defined in any of paragraphs 1-7, wherein the property is at least one of a porosity, permeability, or pore size of the formation.

9. A method as defined in any of paragraphs 1-8, wherein the method is performed in real-time during a downhole logging operation.

10. A system for formation evaluation, comprising a logging assembly to be positioned along a wellbore; and processing circuitry coupled to the logging assembly and configured to implement a method comprising: acquiring nuclear magnetic resonance ("NMR") data of a formation surrounding a wellbore; expressing the NMR data as a least squares solution to a linear system; approximating the least squares solution using numerical decomposition; and determining a property of the formation using the approximated least squares solution.

11. A system as defined in paragraph 10, wherein the approximation is performed using an orthogonal-triangular decomposition method.

12. A system as defined in paragraphs 9 or 10, wherein the NMR data comprises a plurality of echo trains; and the approximation is selectively applied to each echo train separately.

13. A system as defined in any of paragraphs 10-12, wherein selectively applying the approximation to each echo train comprises determining which echo trains to approximate.

14. A system as defined in any of paragraphs 10-13, wherein the NMR data comprises a plurality of echo trains expressed as a matrix $A_i$; and the numerical decomposition is applied to matrix $A_i$.

15. A system as defined in any of paragraphs 10-14, wherein the NMR data comprises a plurality of echo trains expressed as a matrix $A_i$; and the numerical decomposition is applied to a transpose of the matrix $A_i$, the transpose being expressed as $A'_i$.

16. A system as defined in any of paragraphs 10-15, wherein the approximated least squares solution is expressed as:

$$x_{ls} = (\Sigma_{i=1}^{P} A'_i A_i + \alpha L'L)^{-1} (\Sigma_{i=1}^{P} Q_i R_i E_i b_i) = \\ (\Sigma_{i=1}^{P} A'_i A_i + \alpha L'L)^{-1} (\Sigma_{i=1}^{P} \Sigma_{k=1}^{N} (r_{i,k}(E_i b_i)) q_{i,k}) \approx \\ (\Sigma_{i=1}^{P} A'_i A_i + \alpha L'L)^{-1} (\Sigma_{i=1}^{P} \Sigma_{k=1}^{K_i} (r_{i,k}(E_i b_i)) q_{i,k}).$$

17. A system as defined in any of paragraphs 10-16, wherein the property is at least one of a porosity, permeability, or pore size of the formation.

Moreover, the methods described herein may be embodied within a system comprising processing circuitry to implement any of the methods, or a in a non-transitory computer-readable medium comprising instructions which, when executed by at least one processor, causes the processor to perform any of the methods described herein.

Although various embodiments and methods have been shown and described, the disclosure is not limited to such embodiments and methods and will be understood to include all modifications and variations as would be apparent to one skilled in the art. Therefore, it should be understood that the disclosure is not intended to be limited to the particular forms disclosed. Rather, the intention is to cover all modifications, equivalents and alternatives falling within the spirit and scope of the disclosure as defined by the appended claims.

What is claimed is:

1. A formation evaluation method, comprising:
acquiring nuclear magnetic resonance ("NMR") data of a formation surrounding a wellbore, the NMR data having a plurality of echo trains expressed as a matrix $A_i$;
expressing an inversion of the NMR data as a least squares solution to a linear system;
approximating the least squares solution using numerical decomposition by compressing a projection of the NMR data into a transpose of the matrix $A_i$ using an expression A'b, wherein the approximation is selectively applied to each echo train separately; and determining a property of the formation using the approximated least squares solution.

2. The method as defined in claim 1, wherein the approximation is performed using an orthogonal-triangular decomposition method.

3. The method as defined in claim 1, wherein selectively applying the approximation to each echo train comprises determining which echo trains to approximate.

4. The method as defined in claim 1, wherein the approximated least squares solution is expressed as:

$$x_{ls} = (\Sigma_{i=1}^{P} A'_i A_i + \alpha L'L)^{-1} (\Sigma_{i=1}^{P} Q_i R_i E_i b_i) =$$
$$(\Sigma_{i=1}^{P} A'_i A_i + \alpha L'L)^{-1} (\Sigma_{i=1}^{P} \Sigma_{k=1}^{N} (r_{i,k}(E_i b_i)) q_{i,k}) \approx$$
$$(\Sigma_{i=1}^{P} A'_i A_i + \alpha L'L)^{-1} (\Sigma_{i=1}^{P} \Sigma_{k=1}^{K_i} (r_{i,k}(E_i b_i)) q_{i,k}).$$

5. The method as defined in claim 1, wherein the property is at least one of a porosity, permeability, or pore size of the formation.

6. The method as defined in claim 1, wherein the method is performed in real-time during a downhole logging operation.

7. A system for formation evaluation, comprising:

a logging assembly to be positioned along a wellbore; and processing circuitry coupled to the logging assembly and configured to implement a method comprising:

acquiring nuclear magnetic resonance ("NMR") data of a formation surrounding a wellbore, the NMR data having a plurality of echo trains expressed as a matrix $A_i$;

expressing an inversion of the NMR data as a least squares solution to a linear system;

approximating the least squares solution using numerical decomposition by compressing a projection of the NMR data into a transpose of the matrix $A_i$ using an expression A'b, wherein the approximation is selectively applied to each echo train separately; and determining a property of the formation using the approximated least squares solution.

8. The system as defined in claim 7, wherein the approximation is performed using an orthogonal-triangular decomposition method.

9. The system as defined in claim 7, wherein selectively applying the approximation to each echo train comprises determining which echo trains to approximate.

10. The system as defined in claim 7, wherein the property is at least one of a porosity, permeability, or pore size of the formation.

11. A non-transitory computer readable medium comprising instructions which, when executed by at least one processor, causes the processor to perform the method comprising:

acquiring nuclear magnetic resonance ("NMR") data of a formation surrounding a wellbore, the NMR data having a plurality of echo trains expressed as a matrix $A_i$;

expressing an inversion of the NMR data as a least squares solution to a linear system;

approximating the least squares solution using numerical decomposition by compressing a projection of the NMR data into a transpose of the matrix $A_i$ using an expression A'b, wherein the approximation is selectively applied to each echo train separately; and determining a property of the formation using the approximated least squares solution.

12. The computer readable medium of claim 11, wherein the approximation is performed using an orthogonal-triangular decomposition method.

13. The computer readable medium of claim 11, wherein selectively applying the approximation to each echo train comprises determining which echo trains to approximate.

* * * * *